(12) United States Patent
Chun

(10) Patent No.: US 7,142,028 B2
(45) Date of Patent: Nov. 28, 2006

(54) CLOCK DUTY RATIO CORRECTION CIRCUIT

(75) Inventor: Jun Hyun Chun, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,183

(22) Filed: Jun. 30, 2004

(65) Prior Publication Data

US 2005/0184780 A1  Aug. 25, 2005

(30) Foreign Application Priority Data

Feb. 23, 2004 (KR) ............ 10-2004-0011936

(51) Int. Cl.
*H03K 3/017* (2006.01)
(52) U.S. Cl. ................. 327/175; 327/172
(58) Field of Classification Search ....... 327/172–176, 327/178–179
See application file for complete search history.

(56) References Cited

U.S. PATENT DOCUMENTS

| 5,315,164 | A | * | 5/1994 | Broughton | 327/175 |
| 5,572,158 | A | * | 11/1996 | Lee et al. | 327/175 |
| 6,060,922 | A | * | 5/2000 | Chow et al. | 327/175 |
| 6,169,434 | B1 | * | 1/2001 | Portmann | 327/175 |
| 6,198,322 | B1 | | 3/2001 | Yoshimura | 327/175 |
| 6,285,226 | B1 | * | 9/2001 | Nguyen | 327/175 |
| 6,380,778 | B1 | | 4/2002 | Uehara et al. | |
| 6,518,809 | B1 | * | 2/2003 | Kotra | 327/175 |
| 6,525,581 | B1 | | 2/2003 | Choi | |
| 6,603,337 | B1 | | 8/2003 | Cho | |

FOREIGN PATENT DOCUMENTS

| JP | 04-364603 | 12/1992 |
| JP | 11-272303 | 10/1999 |
| JP | 2001-326564 | 11/2001 |
| JP | 2002-290214 | 10/2002 |
| JP | 2003-110411 | 4/2003 |

* cited by examiner

*Primary Examiner*—Dinh T. Le
(74) *Attorney, Agent, or Firm*—Heller Ehrman LLP (57) ABSTRACT

A clock duty ratio correction circuit corrects a duty ratio of internal clock signals at 1:1. The clock duty ratio correction circuit comprises a clock buffer unit, a charge pump unit, a comparison control unit, a voltage comparison unit, a counter and a D/A converter. The clock duty ratio correction circuit converts a differential internal clock signal into a voltage level corresponding to the pulse width of the differential internal clock signal, and compares the voltage level to generate a count signal. Additionally, the clock duty ratio correction circuit divides a reference voltage at a predetermined ratio in response to the count signal to generate a duty ratio correcting signal, and corrects the duty ratio of the differential internal clock signal by using the voltage level difference of the duty ratio correcting signal.

9 Claims, 8 Drawing Sheets

CLOCK DUTY RATIO CORRECTION CIRCUIT

BACKGROUND OF THE INVENTION

1. Field of the Invention

The present invention generally relates to a clock duty ratio correction circuit for maintaining a clock signal to have a duty ratio of 1:1, and more specifically, to a clock duty ratio correction circuit for electrically converting an internal clock signal and then generating the internal clock signal having a predetermined duty ratio of 1:1 regardless of an externally applied clock signal by using a level difference of the converted electrical signal.

2. Description of the Prior Art

It is important to precisely control a duty ratio of a clock signal in a semiconductor device for inputting/outputting data by using the clock signal.

In generally, a clock signal having a duty ratio of 50% has been widely used in a digital clock application field such as a semiconductor integrated circuit. The 50% duty ratio means that a high level of the clock signal is the same as a low level of the clock signal.

Therefore, a duty ratio correction circuit is used to generate a clock signal having a duty ratio of 50% in a semiconductor device. If the duty ratio correction circuit receives a clock signal having other duty ratio except 50%, it converts the clock signal to have a duty ratio of 50%.

Figure 1:
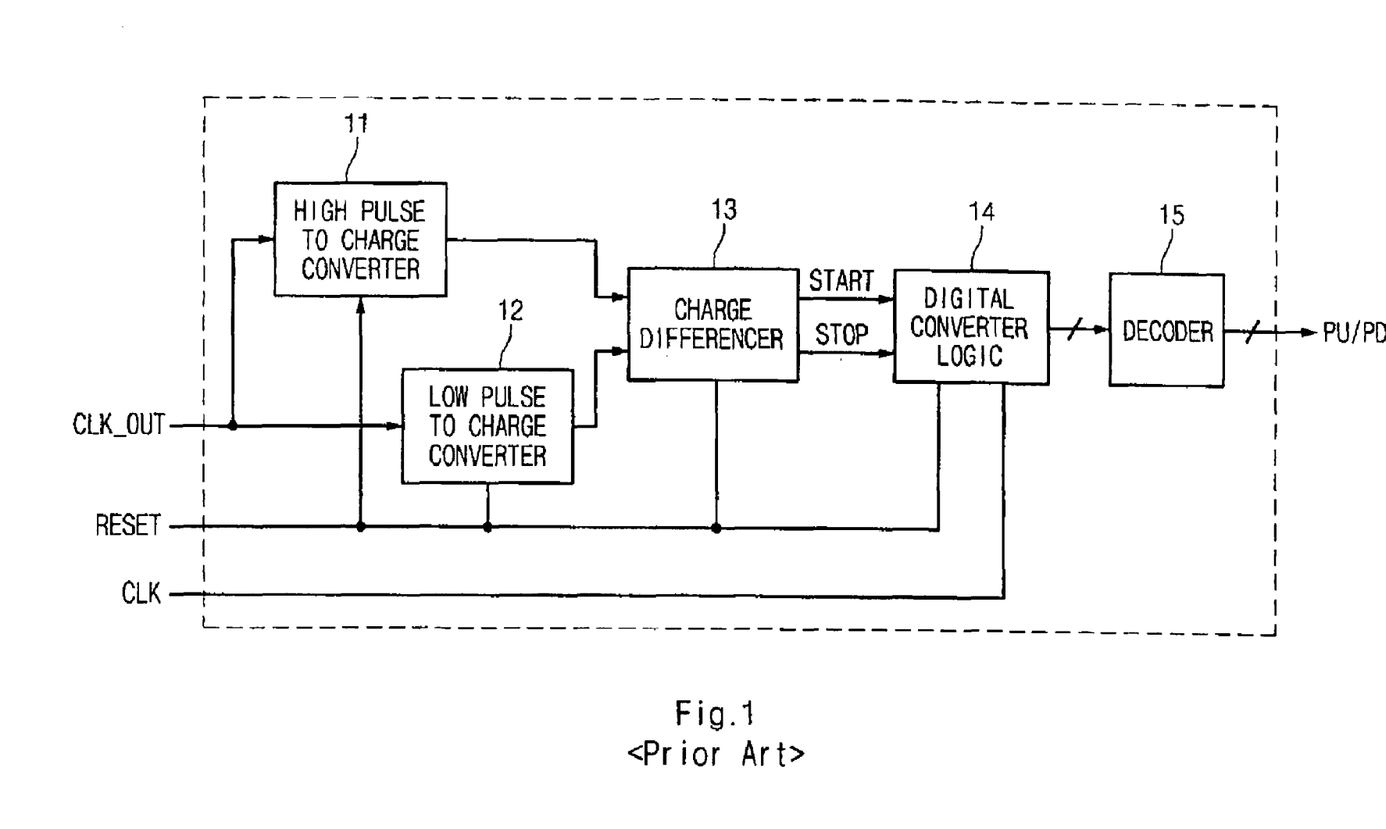
FIG. 1 is a block diagram of a conventional clock duty ratio correction circuit.
Figure 2:
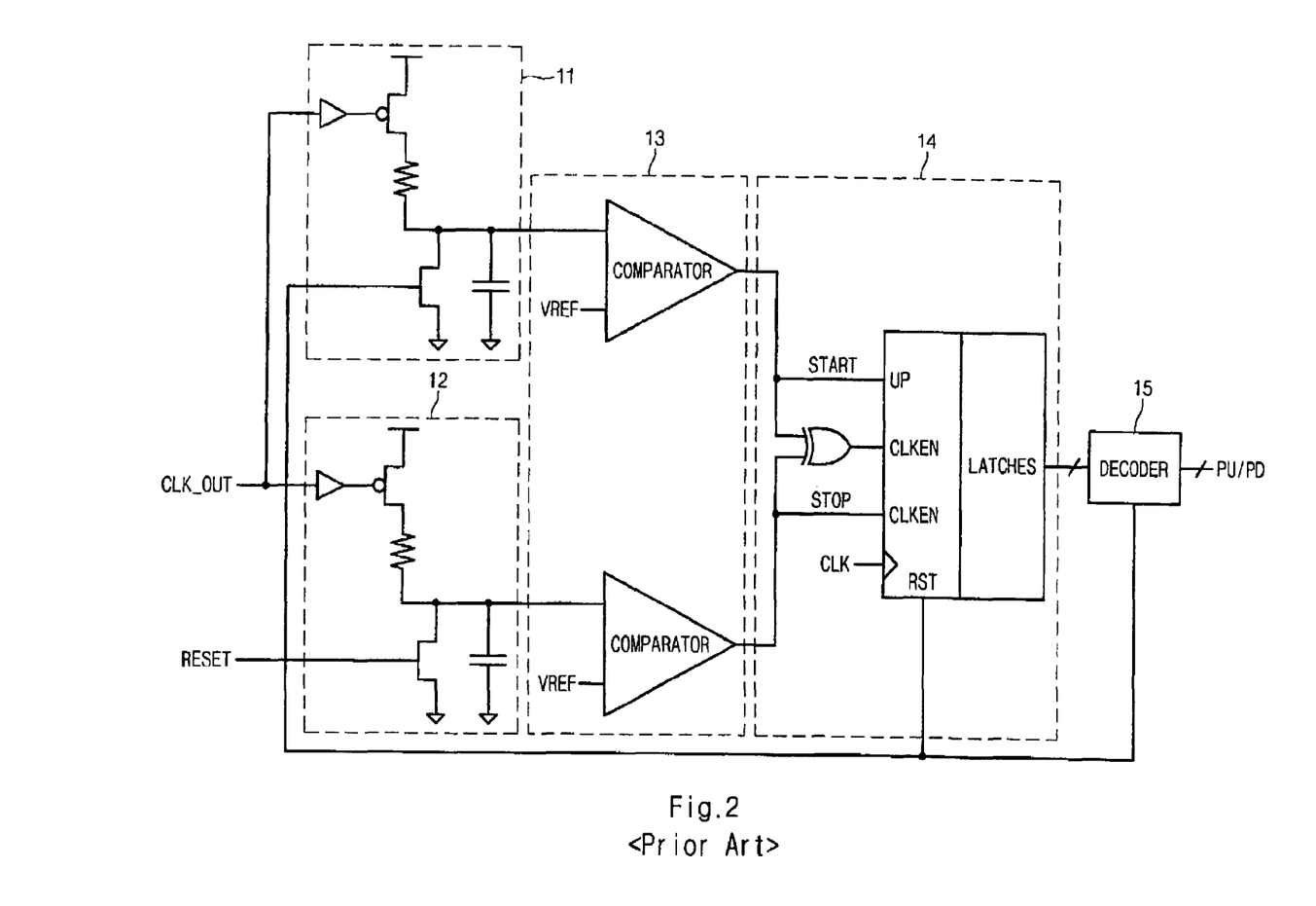
FIG. 2 is a detailed circuit diagram of FIG. 1.

FIG. 1 is a block diagram of a clock duty ratio correction circuit disclosed in the U.S. Pat. No. 6,518,809. FIG. 2 is a detailed circuit diagram of FIG. 1.

The clock duty ratio correction circuit comprises a high pulse to charge converter 11, a low pulse to charge converter 12, a charge differencer 13, a digital converter logic 14 and a decoder 15.

The pulse to charge converters 11 and 12 convert a high level pulse width and a low level pulse width of a clock signal CLK_OUT outputted from a clock driving circuit (not shown) into a voltage level, respectively. The clock signal converted into a voltage level is compared with a reference voltage VREF previously set in the charge differencer 13. The charge differencer 13 generates driving signals START and STOP in response to the comparison result to drive the digital converter logic 14. The digital converter logic 14 performs a binary counting operation in response to the driving signals START and STOP, and outputs a counting signal having a plurality of bits to the decoder 15. The decoder 15 outputs a control signal PU/UD for correcting a duty ratio of the clock signal CLK_OUT depending on a counting value to the clock driving circuit (not shown). The control signal PU/PD turns on/off a PU/PD MOS (not shown) of the clock driving circuit, and controls the clock signal CLK_OUT to have its duty ratio of 50%.

The conventional clock duty ratio correction circuit regulates the duty ratio by controlling the size of MOS transistors in the clock driving unit for generating a clock signal. However, the method of controlling the size of MOS transistors has degraded correction resolution, and its use is improper in a system for receiving a differential clock signal.

In addition, the clock duty ratio correction circuit of FIG. 1 has more comparison errors than a direct comparison method since it compares output voltages of the pulse to charge converters 11 and 12 with the previously set reference voltage. Also, the clock duty ratio correction circuit of FIG. 1 has large power consumption because it uses two comparators for voltage comparison as shown in FIG. 2.

SUMMARY OF THE INVENTION

Accordingly, it is an object of the present invention to providing an improved clock duty ratio correction circuit for correcting a duty ratio of high resolution with low power consumption in a semiconductor device using a differential clock signal, thereby enabling the semiconductor device to be stably operated even at high frequency.

In an embodiment, a clock duty ratio correction circuit comprises a clock buffer unit, a charge pump unit, a comparison control unit, a voltage comparison unit, a counter and a D/A converter.

The clock buffer unit corrects a duty ratio of a differential internal clock signal using a voltage level difference of duty ratio correcting signals. The charge pump unit converts the differential internal clock signal into a voltage level corresponding to a pulse width of the differential internal clock signal in response to a pump control signal. The comparison control unit outputs the pump control signal and a comparison control signal in response to the differential internal clock signal. The voltage comparison unit activates a counting control signal by comparing a voltage level of signals outputted from the charge pump unit in response to the comparison control signal. The counter increases or decreases a plurality of bit counter signals by a predetermined unit in response to the counting control signal. The D/A converter divides a reference voltage at a predetermined ratio in response to the counter signal and outputting the duty ratio correcting signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 3:
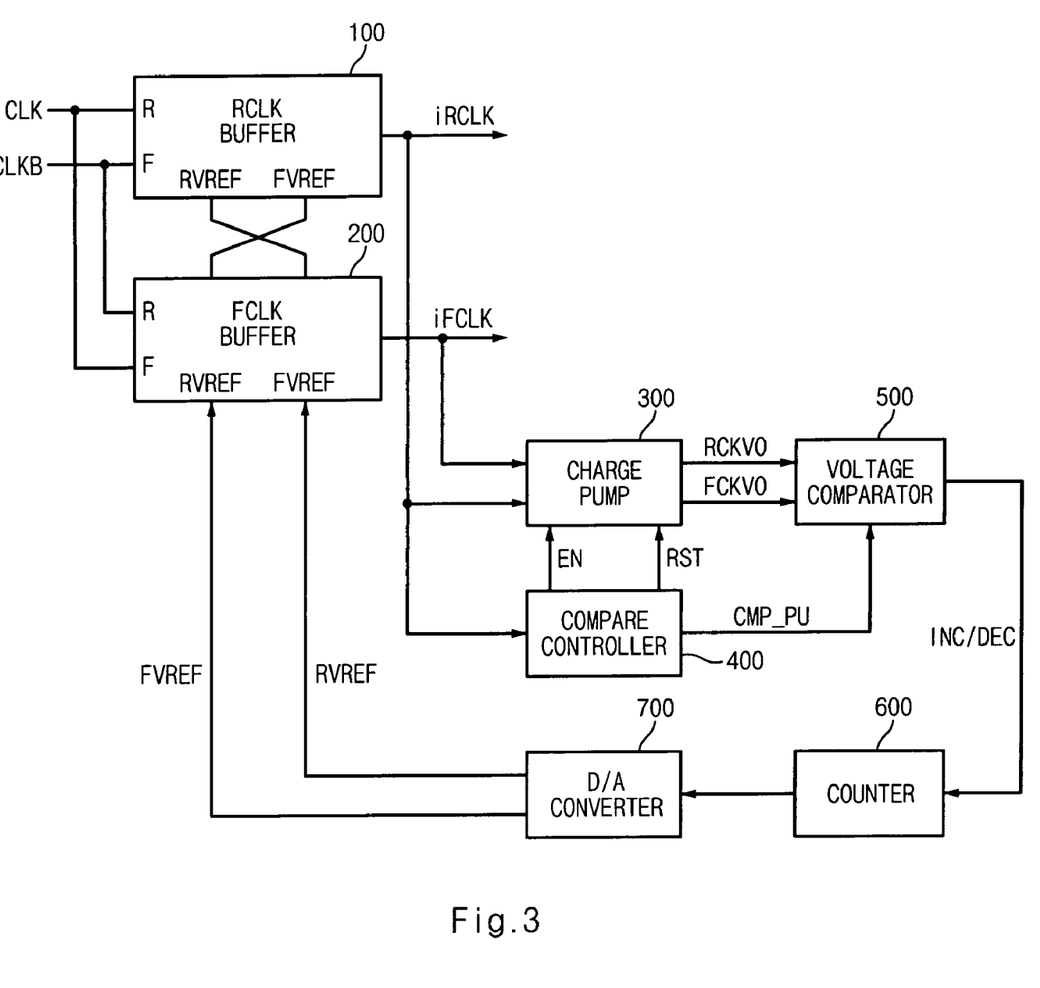
FIG. 3 is a block diagram of a clock duty ratio correction circuit according to an embodiment of the present invention.

FIG. 3 is a block diagram of a clock duty ratio correction circuit according to an embodiment of the present invention.

In an embodiment, the clock duty ratio correction circuit comprises a rising clock buffer 100, a falling clock buffer 200, a charge pump unit 300, a comparison control unit 400, a voltage comparison unit 500, a counter 600 and a D/A converter 700.

The rising clock buffer 100 and the falling clock buffer 200 correct differential internal clock signals iRCLK and iFCLK to have a duty ratio of 1:1 depending on voltage levels of duty ratio correcting signals RVREF/FVREF applied from the D/A converter 700 regardless of the duty ratio of differential clock signals CLK and CLKB inputted externally. Then, the clock buffers 100 and 200 change a logic threshold of a NMOS transistor connected serially to a NMOS transistor for receiving the differential clock signals CLK and CLKB by using a voltage level difference of the duty ratio correcting signals RVREF/FVREF. As a result, the amount of current flowing through the corresponding NMOS transistors is controlled, and the duty ratio of the differential internal clock signals iRCLK and iFCLK is corrected. The above-described rising clock buffer 100 and falling clock buffer 200 buffer the clock signals CLK and CLKB. Although the configuration of the rising clock buffer 100 is the same as that of the falling clock buffer 200, the duty ratio correcting signals RVREF/FVREF and the differential clock signals CLK/CLKB are applied to different locations.

The charge pump unit 300 converts the differential internal clock signals iRCLK and iFCLK outputted from the clock buffers 100 and 200 into voltage levels RCKVO and FCKVO corresponding to pulse widths of the signals iRCLK and iFCLK when an enable signal EN and a reset signal RST which are pump control signals are activated. The charge pump unit 300 precharges the output signals to have the same voltage level.

The comparison control unit 400 generates the pump control signals EN and RST and a comparison control signal CMP_PU in a predetermined cycle in response to the internal clock signal iRCLK, and outputs the signals to the charge pump unit 300 and the comparison unit 500 respectively. The comparison control unit 400 changes the generation cycle of the pump control signals EN and RST and the comparison control signal CMP_PU if the duty ratio matching of the differential internal clock signals iRCLK and iFCLK is completed.

When the comparison control signal CMP_UP is activated, the voltage comparison unit 500 compares the output signals RCKVO and FCKVO from the charge pump unit 300 which are converted into voltage levels, and selectively activates counting control signals INC or DEC depending on the comparison result.

The counter 600 outputs a count signal CNT<0:N−1> having a plurality of bits N, and performs a binary counting operation for increasing or decreasing the size of the count signal CNT<0:N−1> by '1' in response to the counting control signals INC and DEC. That is, the counter 600 increases the count signal CNT by '1' if the counting control signal INC is activated to a high level, and decreases the count signal CNT by '1' if the counting signal DEC is activated to a high level.

The D/A converter 700 divides the reference voltage VDD at a predetermined ratio in response to the count signal CNT<0:N−1> of N bits applied from the counter 600, and outputs the divided signals which are the duty ratio correcting signals RVREF/FVREF having analog voltage levels to the converters 100 and 200. Then, the D/A converter 700 selectively turns on/off a plurality of passive resistance devices connected in parallel in response to the count signal CNT<0:N−1> to output $2^N$ voltage levels. As a result, the amount of current flowing through the passive resistance devices is controlled, and the analog voltage levels of the duty ratio correcting signals RVREF and FVREF is regulated.

Figure 4:
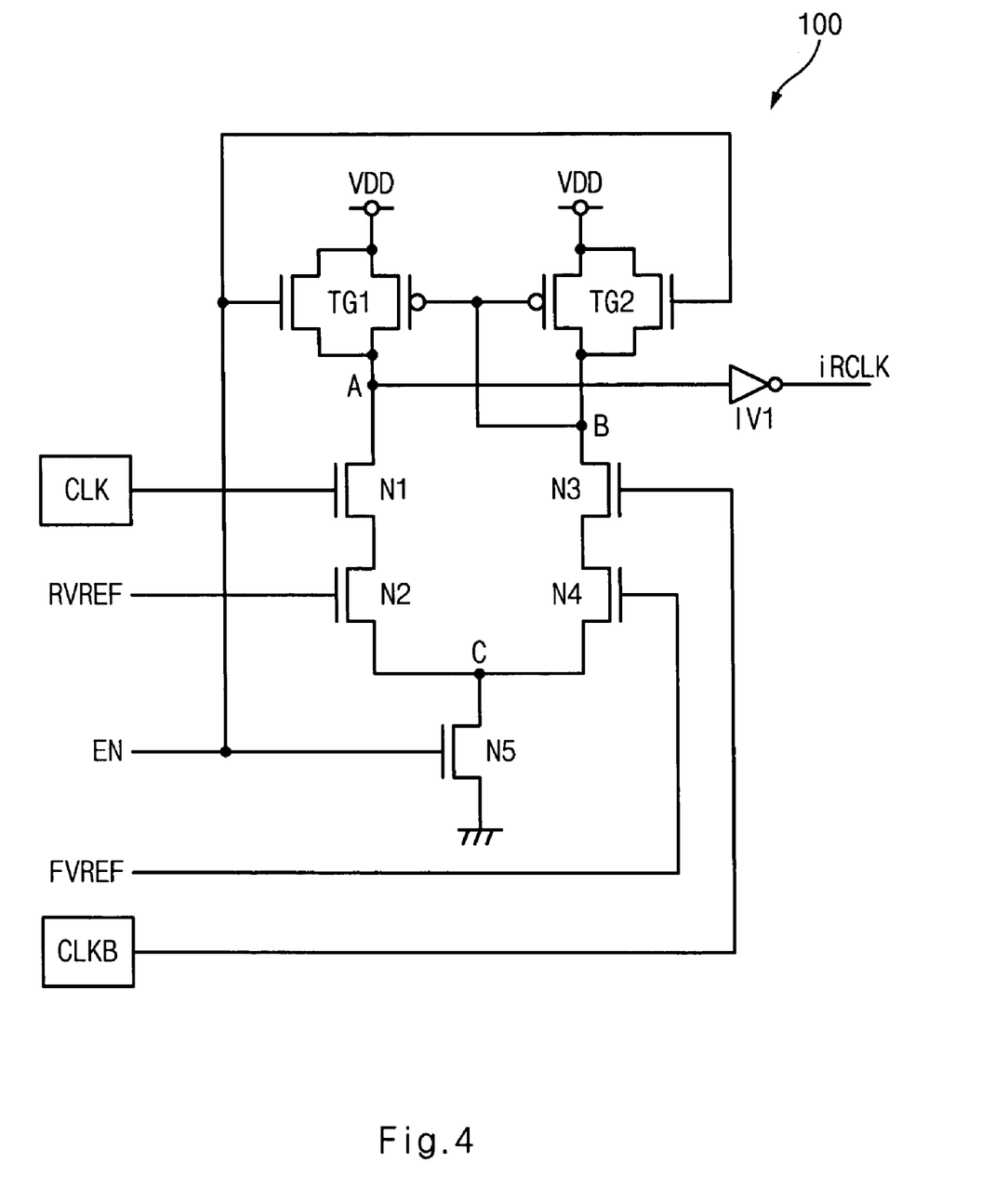
FIG. 4 is a detailed circuit diagram of a rising clock buffer of FIG. 3.

FIG. 4 is a detailed circuit diagram of the rising clock buffer 100 of FIG. 3.

The rising clock buffer 100 comprises transmission gates TG1 and TG2, NMOS transistors N1~N5, and an inverter IV1. The transmission gate TG1 connected between a power voltage terminal VDD and an output node A is turned on/off in response to the enable signal EN and a signal of a node B. The transmission gate TG2 connected between the power voltage terminal VDD and the node B is turned on/off in response to the signal of the node B and the enable signal EN. The NMOS transistors N1 and N2 connected serially between output nodes A and C have their gates to receive the clock signal CLK and the duty ratio correcting signal RVREF, respectively. The NMOS transistors N3 and N4 connected serially between the nodes B and C have their gates to receive the clock signal CLKB and the duty ratio correcting signal FVREF, respectively. The NMOS transistor N5 connected between the node C and a ground power has its gate to receive the enable signal EN. The inverter IV1 inverts a signal of the output node A, and outputs the internal clock signal iRCLK.

The falling clock buffer 200 has the same configuration as that of the rising clock buffer 100. However, the differential clock signals CLK/CLKB and the duty ratio correcting signals RVREF/FVREF are applied in an opposite direction each other in the falling clock buffer 200. Accordingly, the falling clock buffer 200 is not shown herein.

Figure 5:
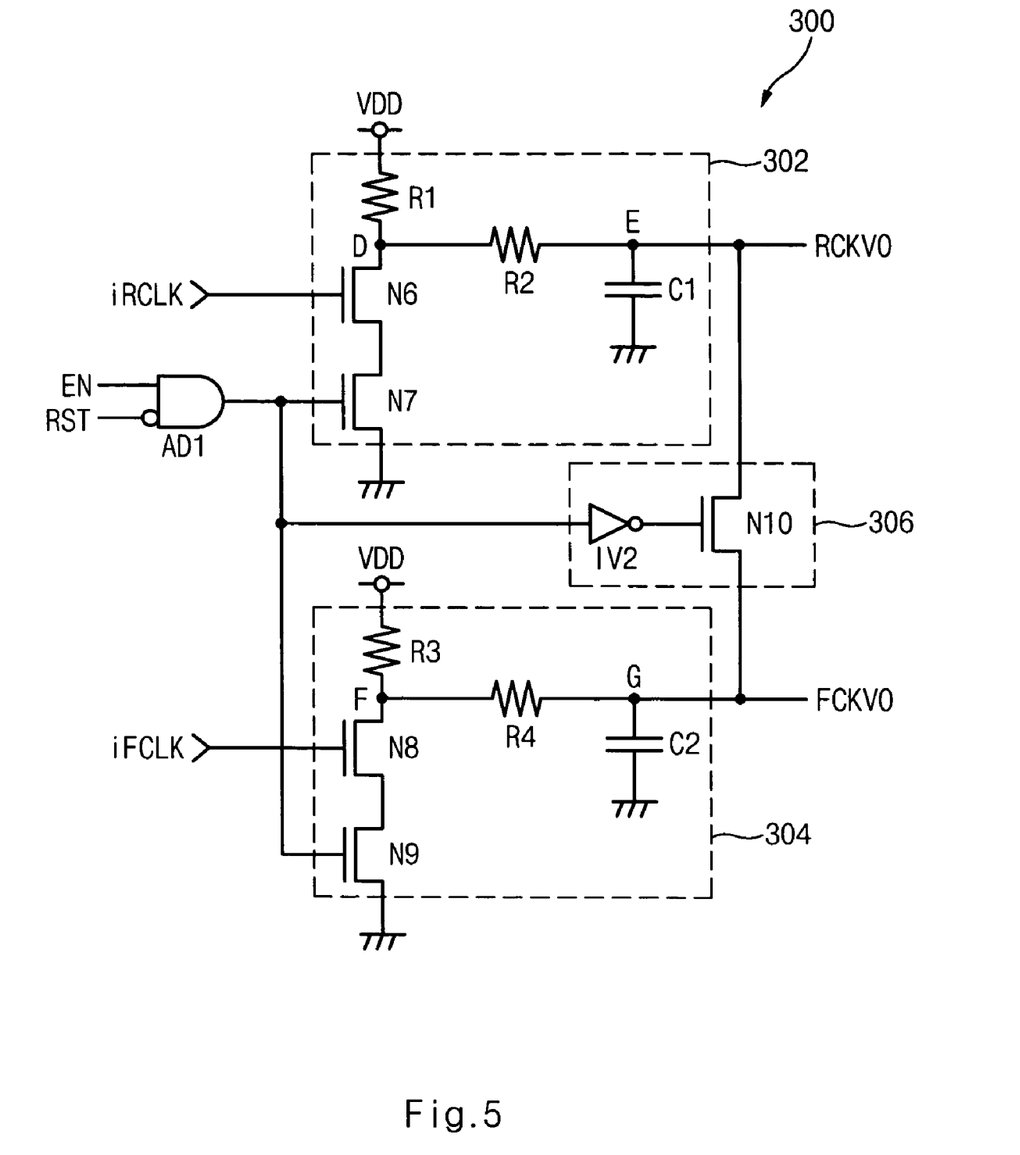
FIG. 5 is a detailed circuit diagram of a charge pump unit of FIG. 3.

FIG. 5 is a detailed circuit diagram of the charge pump unit 300 of FIG. 3.

The charge pump unit 300 comprises an AND gate AD1, a first voltage converting unit 302, a second voltage converting unit 304 and an output voltage equivalent unit 306.

The AND gate AD1 activates the first voltage converting unit 302 and the second voltage converting unit 304 in response to the enable signal EN and the reset signal RST which are pump control signals. The AND gate AD1 performs an AND operation on the enable signal EN and an inverted reset signal /RST, and outputs the operation result to the first voltage converting unit 302 and the second voltage converting unit 304.

When an output signal from the AND gate AD1 is activated, the first voltage converting unit 302 converts the internal clock signal iRCLK into the voltage level RCKVO corresponding to the pulse width of the signal iRCLK. The first voltage converting unit 302 comprises resistances R1 and R2, NMOS transistors N6 and N7, and a capacitor C1. The resistance R1 is connected between the power voltage terminal VDD and a node D. The NMOS transistors N6 and N7 connected serially between the node D and a ground voltage terminal have their gates to receive the internal clock signal iRCLK and an output signal from the AND gate AD1. The resistance R2 connected between the node D and an output node E. The capacitor C1 is connected between the output node E and the ground voltage terminal.

When the output signal from the AND gate AD1 is activated, the second voltage converting unit 304 converts the internal clock signal iFCLK into the voltage level FCKVO corresponding to the pulse width of the signal iFCLK. The second voltage converting unit 304 comprises resistances R3 and R4, NMOS transistors N8 and N9, and a capacitor C2. The resistance R3 is connected between the power voltage terminal VDD and a node F. The NMOS transistors N8 and N9 connected serially between the node F and the ground voltage terminal have their gates to receive the internal clock signal iFCLK and the output signal from the AND gate AD1, respectively. The resistance R4 is connected between the node F and an output node G. The capacitor C2 is connected between the output node G and the ground voltage terminal.

The output voltage equivalent unit 306 precharges voltages of the output nodes E and G to the same level when the output signal from the AND gate AD1 is inactivated. The output voltage equivalent unit 306 comprises an inverter IV2 for inverting the output signal from the AND gate AD1, and a NMOS transistor N10 which is connected between the output nodes E and G and has its gate to receive an output signal from the inverter IV2.

Figure 6:
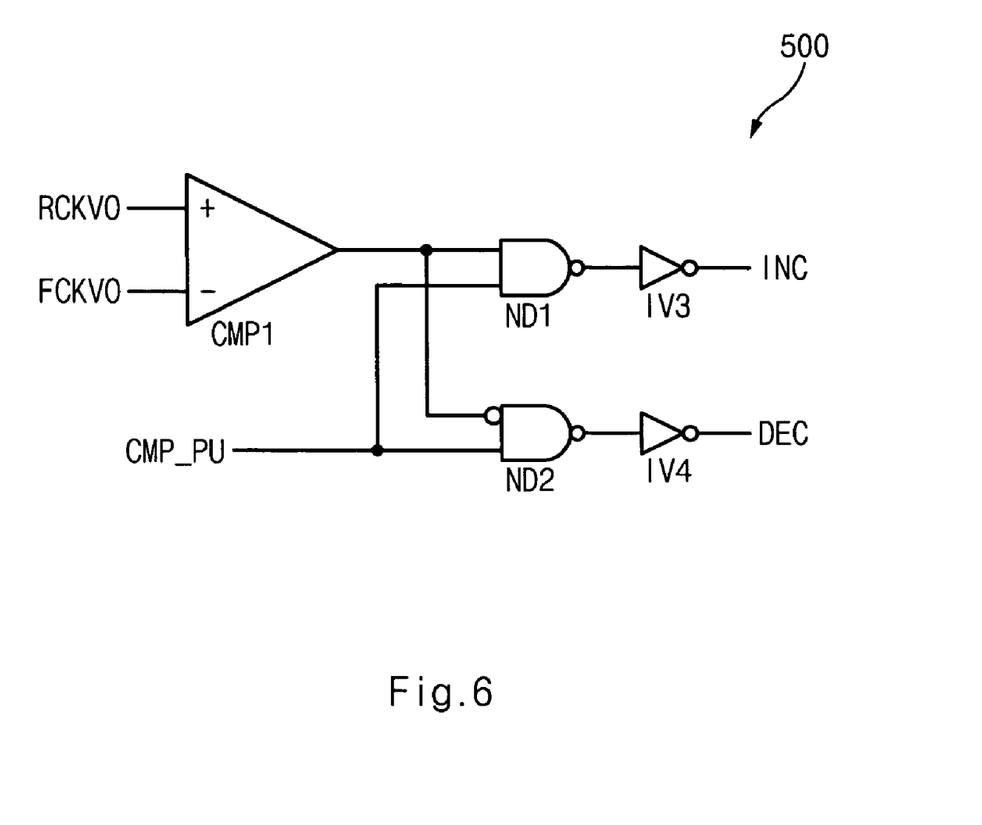
FIG. 6 is a detailed circuit diagram of a voltage comparison unit of FIG. 3.

FIG. 6 is a detailed circuit diagram of the voltage comparison unit 500 of FIG. 3.

The voltage comparison unit 500 comprises a comparator CMP1, NAND gates ND1 and ND2, and inverters IV3 and IV4. The comparator CMP1 compares the voltage levels RCKVO and FCKVO of the output signals from the charge pump unit 300. The NAND gate ND1 performs a NAND operation on the comparison control signal CMP_PU and an output signal from the comparator CMP1. The NAND gate ND2 performs a NAND operation on the comparison control signal CMP_PU and an inverted output signal from the comparator CMP1. The inverter IV3 inverts an output signal from the NAND gate ND1, and outputs the counting control signal INC for increasing the count operation of the counter 600 by '1'. The inverter IV4 inverts an output signal from the NAND gate ND2, and outputs the counting control signal DEC for decreasing the count operation of the counter 600 by '1'. Accordingly, when the comparison control signal CMP_P is activated, the counting control signal INC is activated to a high level if the voltage level RCKVO is higher than the voltage level FCKVO, and the counting control signal DEC is activated to a high level if the voltage level FCKVO is higher than the voltage level RCKVO.

Figure 7:
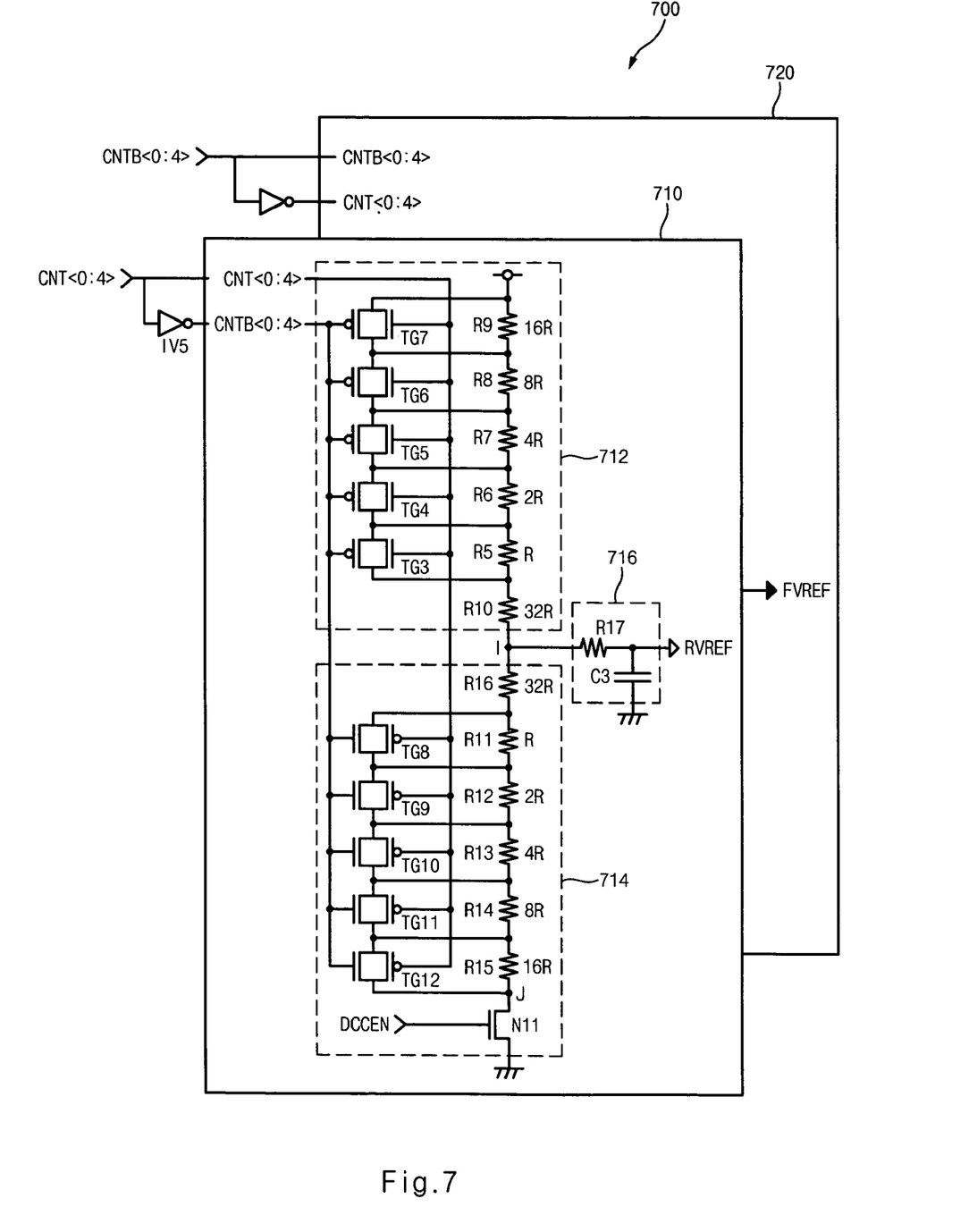
FIG. 7 is a detailed circuit diagram of a D/A converter of FIG. 3.

FIG. 7 is a detailed circuit diagram of the D/A converter 700 of FIG. 3.

The D/A converter 700 comprises a first correcting signal generating unit 710 and a second correcting signal generating unit 720. The first correcting signal generating unit 710 controls on/off operations of the passive resistance devices in response to the count signals CNT<0:N−1>/CNTB<0:N−1> and complements of the count signals CNT<0:N−1>/CNTB<0:N−1>, and outputs a duty ratio correcting signal RVREF. The second correcting signal generating unit 720 controls on/off operations of the passive resistance devices opposite to the first correcting signal generating unit 710 in response to the count signals CNT<0:N−1>/CNTB<0:N−1> and complements of the count signals CNT<0:N−1>/CNTB<0:N−1>, and outputs a duty ratio correcting signal FVREF.

The first correcting signal generating unit 710 comprises a first voltage dividing unit 712, a second voltage dividing unit 714 and a correcting signal output unit 716. The first voltage dividing unit 712 controls on/off operations of the passive resistance devices connected serially in response to the count signals CNT<0:N−1>/CNTB<0:N−1>. The second voltage dividing unit 714 controls on/off operations of the passive resistance devices connected serially in response to the complements of the count signals CNT<0:N−1>/CNTB<0:N−1>. The correcting signal output unit 716 outputs the duty ratio correcting signal RVREF depending on the reference voltage divided by the first voltage dividing unit 712 and the second voltage dividing unit 714.

The first voltage dividing unit 712 comprises resistances R5~R10, transmission gates TG3~TG7 and NMOS transistor Nil. The resistances R5~R10 are connected serially between the power voltage terminal VDD and a node I, and each resistance is $1(2^0)$, $2(2^1)$, $4(2^2)$, $8(2^3)$, ..., $2^{N-1}$ times larger than the base resistance R. Here, the number of serially connected resistances is determined depending on the number of bits of the count signals CNT<0:N−1>/CNTB<0:N−1> of the counter 600. In an embodiment of the present invention, the count signals CNT<0:N−1>/CNTB<0:N−1> of 5 bits are used. The transmission gates TG3~TG7 are connected in parallel to the resistances R5~R9 correspondingly one by one, and turned on/off in response to the count signals CNT<0:4> and CNTB<0:4> to regulate the resistance between the power voltage terminal VDD and the node I. For example, when the count signal CNT<0:4> is '01111', the transmission gates TG3~TG6 are turned on but the transmission gate TG7 is turned off. As a result, the resistance between the power voltage terminal VDD and the node I is 16R+32R=48R.

The second voltage dividing unit 714 comprises resistances R11~R16, and transmission gates TG8~TG12. The resistances R11~R16 are connected serially between nodes I and J to be positioned symmetrically with the resistances R5~R10 around the node I, and each resistance is $1(2^0)$, $2(2^1)$, $4(2^2)$, $8(2^3)$, ..., $2^{N-1}$ times larger than the base resistance R. The transmission gates TG8~TG12 are connected in parallel to the resistances R11~Rl5 correspondingly one by one, and turned on/off in response to the count signals CNT<0:4> and CNTB<0:4> to regulate the resistance between the nodes I and J. Here, the transmission gates TG8~TG12 receive the count signals CNT<0:4> and CNTB<0:4> opposite to the transmission gates TG3~TG7, and perform on/off operations opposite to those of the transmission gates TG3~TG7. For example, when the count signal CNT<0:4> is '01111', the transmission gates TG8~TG11 are turned off but the transmission gate TG12 is turned on. As a result, the resistance between the nodes I and J is 8R+4R+2R+R+32R=47R.

Accordingly, when the count signal CNT<0:4> is '01111', the voltage of the duty ratio correcting signal RVREF outputted from the first correcting signal generating unit 710 becomes (47R/(48R+47R))×VDD=0.495VDD. The NMOS transistor N11 connected between the node J and the ground voltage terminal has its gate to receive an enable signal DCCEN. The enable signal DCCEN is inactivated to a low level in a self-refresh mode (IDD6 mode) of DRAM, and disconnects flowing of current through the resistances R5~R16.

The correcting signal output unit 716 comprises a resistance R17 and a capacitor C3. The resistance R17 is connected between the node I and an output node, and the capacitor C3 is connected between the output node and the ground voltage terminal.

In comparison with the first correcting signal generating unit 710, the second correcting signal generating unit 720 performs on/off operations of the transmission gates opposite to those of the first correcting signal generating unit 720. The other configuration and operation principle is the same as those of the first correcting signal generating unit 710.

When the count signal CNT<0:4> is '01111', the duty ratio correcting signal FVREF outputted from the second correcting signal generating unit 720 becomes (48R/(48R+47R))×VDD=0.505VDD.

In this way, the D/A converter 700 controls the duty ratio correcting signals RVREF and FVREF by regulating the resistances between the power voltage VDD and the node I and between the nodes I and J in response to the count signals CNT<0:4>/CNTB<0:4> and their complements.

Figure 8:
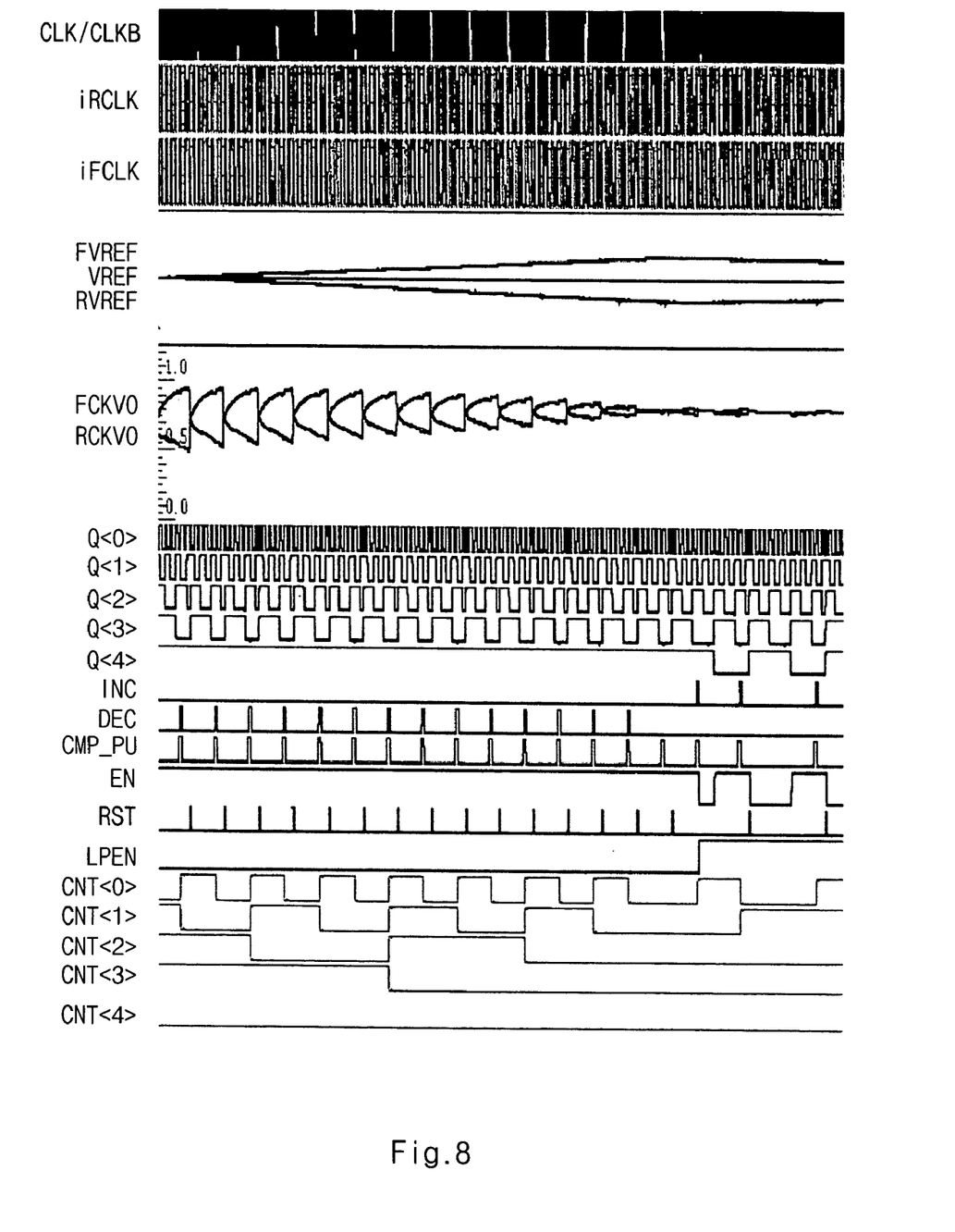
FIG. 8 is a diagram illustrating the operation of the clock duty ratio correction circuit according to an embodiment of the present invention.

FIG. 8 is a diagram illustrating the operation of the clock duty ratio correction circuit according to an embodiment of the present invention.

When the external clock signal CLK is applied at a duty ratio of 0.55×tCK, the internal clock signals iRCLK and iFCLK outputted from the rising clock buffer 100 and the falling clock buffer 200 at the initial operation of the clock duty ratio correcting circuit become 0.55×tCK and 0.45×tCK, respectively.

If the internal clock signals iRCLK and iFCLK are applied to the charge pump unit 300 when the enable signal EN is activated to 'high' and the reset signal RST is activated to 'low', the period while the NMOS transistor N6 is turned on is different from that while the NMOS transistor N8 is turned on depending on the pulse widths of the internal clock signals iRCLK and iFCLK. As a result, the voltages to the corresponding capacitors C1 and C2 are differentiated. That is, since the amount of current leaked by the NMOS transistors N6 and N8 is differentiated, the voltage level RCKVO of the first voltage converting unit 302 where the larger amount of current is leaked becomes lower than the voltage level FCKVO of the second voltage converting unit 304. As a result, the output of the comparator CMP1 becomes 'low'.

Since the output of the comparator CMP1 is 'low', the counting control signal INC becomes 'low' and the counting control signal DEC becomes 'high' when the comparison control signal CMP_PU is activated to 'high', and the signals INC and DEC are applied to the counter 600.

The counter 600 decreases the count by '1' depending on activation of the counting control signal DEC.

For example, when the initial count signal CNT<0:4> of the counter 600 is '01111', the application of the counting control signal DEC changes the count signal CNT<0:4> into '01110' as shown in FIG. 8.

When the count signal CNT<0:4> is '01111', the transmission gates TG3~TG6 are turned on and the transmission gate TG7 is turned off in the first voltage dividing unit 712 for receiving the count signals CNT<0:4>, and the resistance between the power voltage terminal VDD and the node I becomes 48R(16R+32R). In the second voltage dividing unit 714 for receiving the complements of the count signals CNT<0:4>, the transmission gates TG8~TG11 are turned off and the transmission gate TG12 is turned on, and the resistance between the nodes I and J becomes 47R(8R+4R+2R+1R+32R). As a result, the initial voltage level of the duty ratio correcting signal RVREF becomes 47R/(48R+47R))×VDD=0.495VDD.

However, since the transmission gates of second correcting signal generating unit 720 performs the on/off operations opposite to those of the first correcting signal generating unit 710, the initial voltage level of the duty ratio correcting signal FVREF becomes (48R/(48R+47R))×VDD=0.505VDD.

In this way, although the initial voltage difference of the duty ratio correcting signals FVREF and RVREF is shown to be 0.01VDD, the voltage level is almost the same as shown in FIG. 8.

However, if the application of the counting control signal DEC changes the count signal CNT<0:4> into '01110', the transmission gates TG4~TG6 are turned on and the transmission gates TG3 and TG7 are turned off, and the resistance between the power voltage terminal and the node I increases to 49R(16R+1R+32R). Then, the transmission gates TG9~TG11 are turned off and the transmission gates TG8 and TG12 are turned on, and the resistance between the nodes I and J decreases to 46R(8R+4R+2R+32R). As a result, the voltage level of the duty ratio correcting signal RVREF becomes (46R/(49R+46R))×VDD=0.484VDD, and the voltage level of the duty ratio correcting signal FVREF becomes (49R/(49R+46R))×VDD=0.516VDD. The voltage level difference of the two signals increases to 0.032VDD.

If the voltage level of the duty ratio correcting signal RVREF decreases in the rising clock buffer 100, the threshold voltage of the NMOS transistor N2 becomes lower, and the pulse width of the internal clock signal iRCLK decreases a little. On the other hand, the voltage level of the duty ratio correcting signal FVREF increases in the falling clock buffer 200, and the pulse width of the internal clock signal iFCLK increases a little. Accordingly, the duty ratio of the internal clock signals iRCLK and iFCLK is a little corrected.

However, since the duty ratio of the internal clock signals iRCLK and iFCLK is not completely corrected, the level difference in the output voltages RCKVO and FCKVO of the charge pump unit 300 becomes smaller, but the counting control signal DEC is continuously generated with a high pulse by the level difference.

Due to the continuous activation of the counting control signal DEC, the count signal CNT<0:4> continuously decreases by '1'. The decrease of the count signal CNT<0:4> gradually increases the voltage level difference of the duty ratio correcting signals FVREF and RVREF. The increase in the level difference of the duty ratio correcting signals FVREF and RVREF continues until the duty ratio of the internal clock signals iRCLK and iFCLK is completely corrected.

If the duty ratio correction is completed, the comparison control unit 400 changes the generation cycle of the pump control signals EN and RST, and the comparison control signal CMP_PU.

If the pulse width of the internal clock signal iFCLK becomes larger than that of the internal clock signal IRCLK on the contrary to the initial state, the voltage level RCKVO of the charge pump unit 300 becomes larger than the voltage level FCKVO. As a result, the counting control signal INC is activated to a high pulse to increase the count signal CNT<0:4> by '1', and regulates the voltage levels of the duty ratio correcting signals FVREF and RVREF again to correct the duty ratio.

In an embodiment of the present invention, the threshold voltages of the NMOS transistor connected serially to the NMOS transistor for receiving the clock signals CLK/CLKB is regulated. As a result, the duty ratio of the internal clock signals iRCLK and iFCLK is regularly maintained regardless of the duty ratio of the external clock signals CLK/CLKB.

As discussed earlier, a clock duty ratio correction circuit according to an embodiment of the present invention electrically converts internal clock signals, and generates internal clock signals having a duty ratio of 1:1 using the level difference of the converted electrical signals regardless of externally applied clock signals. Accordingly, the duty ratio of high resolution can be corrected with low power consumption in a semiconductor device using a differential clock signal, thereby enabling the semiconductor device to be stably operated even at high frequency.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A clock duty ratio correction circuit comprising:
    a clock buffer unit for correcting duty ratios of a differential internal clock signals depending on a voltage level difference of duty ratio correcting signals;

a charge pump unit for converting the differential internal clock signals into voltage levels corresponding to pulse widths of the differential internal clock signals in response to a pump control signal;

a comparison control unit for outputting the pump control signal and a comparison control signal in response to the differential internal clock signals;

a voltage comparison unit for comparing the voltage levels converted from the charge pump unit in response to the comparison control signal, and outputting a counting control signal;

a counter for increasing or decreasing a plurality of bit counter signals by a predetermined unit in response to the counting control signal; and a D/A converter for dividing a reference voltage at a predetermined ratio in response to the plurality of bit counter signals and outputting the duty ratio correcting signals.

2. The circuit according to claim 1, wherein the clock buffer unit comprises:

a rising clock buffer for correcting the duty ratio of a first internal clock signal of the differential internal clock signals depending on the voltage level difference of the duty ratio correcting signals; and a falling clock buffer for correcting the duty ratio of a second internal clock signal of the differential internal clock signals depending on the voltage level difference of the duty ratio correcting signals.

3. The circuit according to claim 1, wherein the charge pump unit comprises:

a first voltage converting unit for converting a first internal clock signal of the differential internal clock signals into the voltage level corresponding to the pulse width of the first internal clock signal when the pump control signal is activated;

a second voltage converting unit for converting a second internal clock signal of the differential internal clock signals into the voltage level corresponding to the pulse width of the second internal clock signal when the pump control signal is activated; and an output voltage equivalent unit for precharging an output level of the first voltage converting unit to be equal to that of the second voltage converting unit when the pump control signal is inactivated.

4. The circuit according to claim 1, wherein the comparison control unit changes a generation cycle of the pump control signal and the comparison control signal after the duty ratios of the differential internal clock signals are corrected.

5. The circuit according to claim 1, wherein the D/A converter comprises:

a first correcting signal generating unit for outputting a first duty ratio correcting signal of the duty ratio correcting signals by controlling on/off operations of first passive resistance devices depending on the plurality of bit counter signals; and a second correcting signal generating unit for outputting a second duty ratio correcting signal of the duty ratio correcting signals by controlling on/off operations of second passive resistance devices depending on the complement of the plurality of bit counter signals.

6. The circuit according to claim 5, wherein the first correcting signal generating unit comprises:

a first voltage dividing unit comprising a plurality of first resistance devices connected serially and a plurality of transmission gates which are connected in parallel to the corresponding first resistance devices one by one, the plurality of transmission gates being adapted and configured to be turned on/off in response to the plurality of bit counter signals to control an amount of current flowing through the plurality of first resistance devices;

a second voltage dividing unit comprising a plurality of second resistance devices connected serially and a plurality of transmission gates which are connected in parallel to the corresponding second resistance devices one by one, the plurality of transmission gates being adapted and configured to be turned on/off in response to the plurality of bit counter signals to control an amount of current flowing through the plurality of second resistance devices; and a correcting signal output unit for outputting the first duty ratio correcting signal depending on a first reference voltage divided by the first voltage dividing unit and the second voltage dividing unit.

7. The circuit according to claims 2, wherein the rising clock buffer comprises:

a first MOS transistor that has a control terminal which receives a first duty ratio correcting signal of the duty ratio correcting signals; and a second MOS transistor that has a control terminal which receives a second duty ratio correcting signal of the duty ratio correcting signals.

8. The circuit according to claims 2, wherein the falling clock buffer comprises:

a third MOS transistor that has a control terminal which receives a first duty ratio correcting signal of the duty ratio correcting signals; and a fourth MOS transistor that has a control terminal which receives a second duty ratio correcting signal of the duty ratio correcting signals.

9. The circuit according to claim 5, wherein the second correcting signal generating unit comprises:

a third voltage dividing unit comprising a plurality of third resistance devices connected serially and a plurality of transmission gates which are connected in parallel to the corresponding plurality of third resistance devices one by one, the plurality of transmission gates being adapted and configured to be turned on/off in response to the complement of the plurality of bit counter signals to control an amount of current flowing through the plurality of third resistance devices;

a fourth voltage dividing unit comprising a plurality of fourth resistance devices connected serially and a plurality of transmission gates which are connected in parallel to the corresponding plurality of fourth resistance devices one by one, the plurality of transmission gates being adapted and configured to be turned on/off in response to the complement of the plurality of bit counter signals to control an amount of current flowing through the plurality of fourth resistance devices; and a correcting signal output unit for outputting the second duty ratio correcting signal depending on a second reference voltage divided by the third voltage dividing unit and the fourth voltage dividing unit.

* * * * *